United States Patent
Erbetta et al.

(10) Patent No.: US 9,978,936 B2
(45) Date of Patent: May 22, 2018

(54) POST DEPOSITION ADJUSTMENT OF CHALCOGENIDE COMPOSITION IN CHALCOGENIDE CONTAINING SEMICONDUCTORS

(71) Applicant: Micron Technology, Inc., Boise, ID (US)

(72) Inventors: Davide Erbetta, Vimercate (IT); Camillo Bresolin, Vimercate (IT); Silvia Rossini, Lomagna (IT)

(73) Assignee: Micron Technology, Inc., Boise, ID (US)

( * ) Notice: Subject to any disclaimer, the term of this patent is extended or adjusted under 35 U.S.C. 154(b) by 0 days. days.

(21) Appl. No.: 14/518,970

(22) Filed: Oct. 20, 2014

(65) Prior Publication Data

US 2015/0034897 A1    Feb. 5, 2015

Related U.S. Application Data

(62) Division of application No. 12/942,132, filed on Nov. 9, 2010, now Pat. No. 8,865,514.

(51) Int. Cl.
*H01L 45/00* (2006.01)
*H01L 21/02* (2006.01)

(52) U.S. Cl.
CPC .......... *H01L 45/06* (2013.01); *H01L 45/1233* (2013.01); *H01L 45/1253* (2013.01); *H01L 45/143* (2013.01); *H01L 45/144* (2013.01); *H01L 45/1641* (2013.01); *H01L 21/02568* (2013.01); *H01L 21/02664* (2013.01)

(58) Field of Classification Search
CPC .................................................. H01L 45/1641
See application file for complete search history.

(56) References Cited

U.S. PATENT DOCUMENTS

| | | | |
|---|---|---|---|
| 2004/0264234 A1 | 12/2004 | Moore et al. | |
| 2008/0210924 A1* | 9/2008 | Shin | H01L 27/2436 257/4 |
| 2009/0057644 A1* | 3/2009 | Shin | H01L 27/2409 257/4 |
| 2010/0117040 A1* | 5/2010 | Ovshinsky | H01L 45/085 257/2 |
| 2010/0328996 A1* | 12/2010 | Shih | H01L 45/06 365/163 |

(Continued)

OTHER PUBLICATIONS

Karpov et al., "Phase Change Memory with Chalcogenide Selector (PCMS): Characteristic Behaviors, Physical Models and Key Material Properties," MRS Proceedings, Jan. 2010; doi:1250. 10.1557/PROC-1250-G14-01-H07-01.*

(Continued)

*Primary Examiner* — Peniel M Gumedzoe
*Assistant Examiner* — Christopher Johnson
(74) *Attorney, Agent, or Firm* — Dorsey & Whitney LLP

(57) ABSTRACT

The concentration of a constituent within a chalcogenide film used to form a chalcogenide containing semiconductor may be adjusted post deposition by reacting the chalcogenide film with a material in contact with the chalcogenide film. For example, a chalcogenide film containing tellurium may be coated with a titanium layer. Upon the application of heat, the titanium may react with the tellurium to a controlled extent to reduce the concentration of tellurium in the chalcogenide film.

15 Claims, 1 Drawing Sheet

(56) References Cited

U.S. PATENT DOCUMENTS

2011/0180775 A1* 7/2011 Lin ...................... H01L 45/144
257/4

OTHER PUBLICATIONS

Alberici, et al., "Ti diffusion in chalcogenides: a ToF-SIMS depth profile characterization approach", Applied Surface Science 231-232, May 2005, pp. 821-825.

Kim, et al., "Effect of thermal annealing on microstructural properties of Ti/Ge2Sb2Te5/Ti thin films deposited on SiO2/Si substrates by a sputtering method", Science Direct, Applied Surface Science, 2007, pp. 4041-4044.

* cited by examiner

POST DEPOSITION ADJUSTMENT OF CHALCOGENIDE COMPOSITION IN CHALCOGENIDE CONTAINING SEMICONDUCTORS

CROSS-REFERENCE TO RELATED APPLICATION(S)

This application is a divisional of pending U.S. patent application Ser. No. 12/942,132, filed Nov. 9, 2010, which application is incorporated herein by reference, in its entirety, for any purpose.

BACKGROUND OF THE INVENTION

This relates generally to chalcogenide containing semiconductors, including phase change memories and ovonic threshold switches.

Chalcogenide containing semiconductors include a chalcogenide layer which is an alloy of various chalcogens. For example, the well-known GST alloy is a composite of germanium, antimony, and tellurium. Many other alloys are known. In addition to alloys used in phase change memories, chalcogenide alloys are also used for ovonic threshold switches, the difference being that the chalcogenide layer in the ovonic threshold switch normally does not change phase.

DETAILED DESCRIPTION

In some cases, it is advantageous to adjust the composition of chalcogenide layers deposited to form chalcogenide containing semiconductor devices, including phase change memories and ovonic threshold switches. For example, in some cases, it may be appreciated that finer control may be achieved post deposition than is possible through the adjustment of the deposition process. Thus, in some embodiments, after the material is actually deposited, its chemical composition can be altered.

In accordance with one embodiment, the chemical composition may be altered by subsequently depositing a metal film that is reactive with one or more constituents of the deposited chalcogenide film. Upon heat activation, a reaction occurs which depletes the targeted component from the chalcogenide film through reaction with the contacting metal film. The extent of the depletion may be controlled by the amount of the thermal budget and the thickness of the contacting metal film.

Thus, as one example, a GST chalcogenide may be coated with a layer of titanium. When exposed to heat, the titanium reacts with the tellurium in the GST film and, as a result, depletes the tellurium. In this way, the tellurium composition can be adjusted post deposition.

As another example, titanium may be coated on IST (Indium Antimony Tellurium) phase change material. Also, titanium may be deposited on an ovonic threshold switch material including tellurium.

In many cases, the extent of alteration can be controlled with a considerable degree of precision because it is a function of time, temperature, and deposited material thickness.

In some cases, the subsequent post deposition adjustment may be preplanned and may be part of the overall recipe for forming the semiconductor device. In other cases, testing of the chalcogenide films as deposited may suggest a need for fine adjustment, rather than producing less than ideal devices or destroying the wafers with the deposited chalcogenide film.

Figure 1:
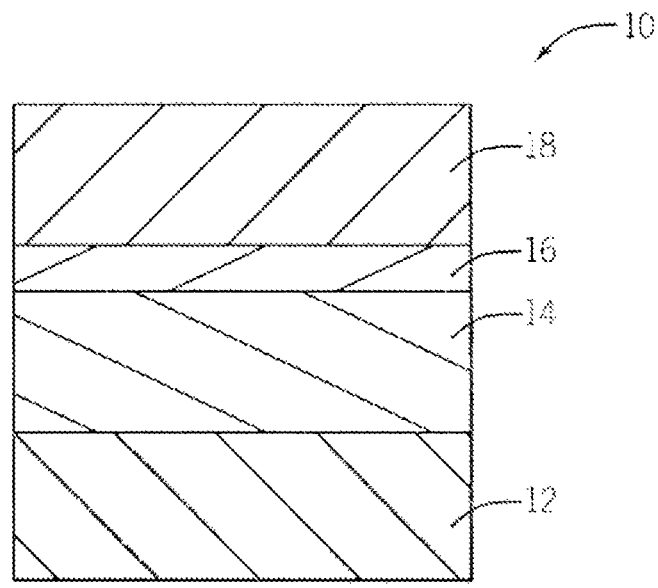
FIG. 1 is an enlarged, cross-sectional view at an early stage of manufacture according to one embodiment.

Thus, for example, referring to FIG. 1, an example of a chalcogenide containing semiconductor 10 may include a bottom electrode 12, a chalcogenide film 14, a thin titanium film 16 deposited thereover, and a top electrode 18.

Figure 2:
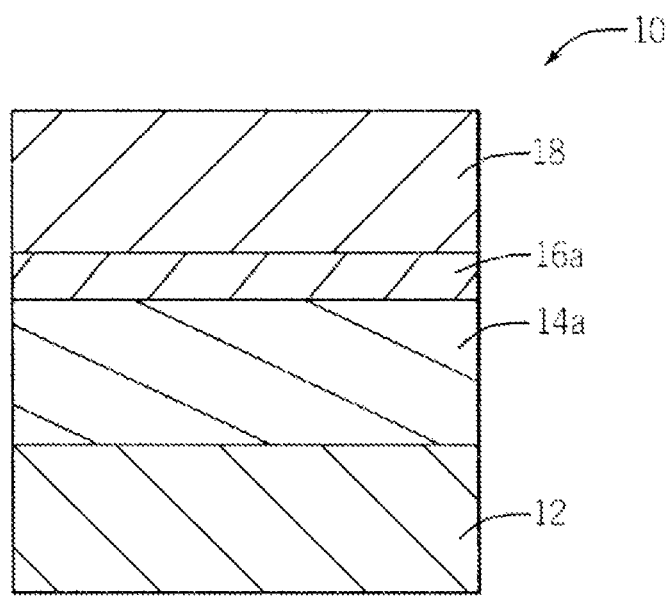
FIG. 2 is an enlarged, cross-sectional view at a subsequent stage in accordance with one embodiment.

The structure 10, shown in FIG. 1, may then be subjected to sufficient heating to create a reaction between tellurium in the chalcogenide film 14 and the titanium film 16. As a result, the tellurium reacts with the titanium film to form the titanium tellurium based alloy film 16a, shown in FIG. 2. Due to heating, the tellurium diffuses into the titanium film 16 and reacts with the film 16. The chalcogenide film 14a has now been depleted of tellurium to a controlled extent in some embodiments. The extent of depletion is controlled based on thermal budget and titanium layer thickness.

The same concepts can be applied to any chalcogenide alloy or phase change material formed by physical vapor deposition or chemical vapor deposition, as two examples. Thus, for example, the film 14, in one embodiment, may be GST and the electrodes 12 and 18 may be titanium nitride.

Also, selenium in chalcogenide material may be reacted with a titanium metal coating. Cobalt metal may also react with tellurium in the chalcogenide.

Programming to alter the state or phase of the material may be accomplished by applying voltage potentials to address lines, thereby generating a voltage potential across a memory element including a phase change film 14a. When the voltage potential is greater than the threshold voltages of any select device and memory element, then an electrical current may flow through the phase change film 14a in response to the applied voltage potentials, and may result in heating of the phase change film 14a.

This heating may alter the memory state or phase of the film 14a, in one embodiment. Altering the phase or state of the film 14a may alter the electrical characteristic of memory material, e.g., the resistance or threshold voltage of the material may be altered by altering the phase of the memory material. Memory material may also be referred to as a programmable resistance material.

In the "reset" state, memory material may be in an amorphous or semi-amorphous state and in the "set" state, memory material may be in a crystalline or semi-crystalline state. The resistance of memory material in the amorphous or semi-amorphous state may be greater than the resistance of memory material in the crystalline or semi-crystalline state. It is to be appreciated that the association of reset and set with amorphous and crystalline states, respectively, is a convention and that at least an opposite convention may be adopted.

Using electrical current, memory material may be heated to a relatively higher temperature to melt and then quenched to vitrify and "reset" memory material in an amorphous state (e.g., program memory material to a logic "0" value). Heating the volume of memory material to a relatively lower crystallization temperature may crystallize or devitrify memory material and "set" memory material (e.g., program memory material to a logic "1" value). Various resistances of memory material may be achieved to store information by varying the amount of current flow and duration through the volume of memory material.

An ovonic threshold switch is either on or off depending on the amount of voltage potential applied across the switch and, more particularly, whether the current through the switch exceeds its threshold current or voltage, which then triggers the device into an on state. The off state may be substantially electrically non-conductive and the on state may be a substantially conductive state with less resistance than the off state.

In the on state, the voltage across the switch, in one embodiment, is equal to its holding voltage $V_{hold}+IR_{on}$, where $R_{on}$ is the dynamic resistance from the extrapolated X axis intercept $V_{hold}$. For example, an ovonic threshold switch may have a threshold voltage $V_{th}$ and, if a voltage potential less than the threshold voltage of the switch is applied across the switch, then the switch may remain off or in a relatively high resistance state so that little or no electrical current passes.

Alternatively, if a voltage potential greater than the threshold voltage of the select device is applied across the device, then the device may turn on, i.e., operate in a relatively low resistance state so that significant electrical current passes through the switch. In other words, one or more series connected switches may be in a substantially electrically non-conductive state at less than a predetermined voltage, e.g., the threshold voltage as applied across a switch. The switch may be in a substantially conductive state if greater than a predetermined voltage is applied across the switch.

In one embodiment, each switch may comprise a switch material that is a chalcogenide alloy. The switch material may be a material in a substantial amorphous state positioned between two electrodes that may be repeatedly and reversibly switched between a higher resistance off state that is generally greater than about 1 megaOhms and a relatively lower resistance on state that is generally less than about 1000 Ohms in series with the holding voltage by the application of electrical current or potential.

Each switch is a two-terminal device that has an IV curve similar to that of a phase change memory element that is in an amorphous state. However, unlike a phase change memory element, the ovonic threshold switch does not change phase. That is, the switching material of the ovonic threshold switch is not a phase programmable material and, as a result, the switch may not be a memory device capable of storing information. For example, the switching material may remain permanently amorphous and the IV characteristics may remain the same throughout the operating life.

In the low voltage, low electric field mode, where the voltage applied across the switch is less than the threshold voltage $V_{th}$, the switch may be off or non-conducting and exhibits a relatively high resistance. The switch may remain in the off state until a sufficient voltage, namely, the threshold voltage, is applied or a sufficient current is applied, namely, the threshold current, that switches the device to a conductive relatively low resistance on state. After a voltage potential of greater than about the threshold voltage is applied across the device, the voltage potential across the device may drop or snapback to a holding voltage $V_{hold}$. Snapback may refer to the voltage difference between the threshold voltage and the holding voltage of the switch.

In the on state, the voltage potential across the switch may remain close to the holding voltage as current passing through the switch is increased. The switch may remain on until the current through the switch drops below a holding current. Below this value, the switch may turn off and return to a relatively high resistance, non-conductive off state, until the threshold voltage and current are again exceeded.

References throughout this specification to "one embodiment" or "an embodiment" mean that a particular feature, structure, or characteristic described in connection with the embodiment is included in at least one implementation encompassed within the present invention. Thus, appearances of the phrase "one embodiment" or "in an embodiment" are not necessarily referring to the same embodiment. Furthermore, the particular features, structures, or characteristics may be instituted in other suitable forms other than the particular embodiment illustrated and all such forms may be encompassed within the claims of the present application.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. An apparatus comprising:
   a first electrode;
   a chalcogenide film including a first constituent;
   a metallic alloy layer in contact with said chalcogenide film, wherein the metallic alloy layer includes a titanium-tellurium alloy;
   a second electrode in direct contact with said metallic alloy layer, said metallic alloy layer including a material reactive with said constituent in said chalcogenide film responsive to a post-deposition heat activation process and said metallic alloy layer including the first constituent of said chalcogenide film.

2. The apparatus of claim 1, wherein said chalcogenide film includes tellurium.

3. The apparatus of claim 1, wherein said chalcogenide film forms a phase change memory.

4. The apparatus of claim 1, wherein said chalcogenide film forms an ovonic threshold switch.

5. An apparatus comprising:
   a first electrode including titanium nitride;
   a chalcogenide film in contact with the first electrode;
   a titanium film in contact with the chalcogenide film, wherein the titanium film is reactive with the chalcogenide film responsive to a post-deposition heat activation process to reduce concentration of a material of the chalcogenide film, the titanium film including an alloy of titanium and reactant from the chalcogenide film, wherein the titanium film includes a titanium-tellurium film; and
   a second electrode in direct contact with the titanium film, wherein the second electrode includes titanium nitride.

6. The apparatus of claim 5, wherein the chalcogenide film includes tellurium.

7. The apparatus of claim 5, wherein the chalcogenide film includes selenium.

8. The apparatus of claim 5, wherein the chalcogenide film includes an indium-antimony-tellurium film.

9. The apparatus of claim 5, wherein the chalcogenide film includes a germanium-antimony-tellurium film.

10. The apparatus of claim 5, wherein the first electrode is a bottom electrode and the second electrode is a top electrode.

11. An apparatus comprising:
    a phase change material in contact with a first electrode, wherein the first electrode includes a first metal nitride; and
    a metallic film disposed between and in contact with the phase change material and in direct contact with a second electrode, wherein the metallic film is reactive with the phase change material responsive to a post-deposition heat activation process to change concentration of a material of the phase change material, wherein the second electrode includes a second metal nitride, wherein the metallic film includes titanium, wherein the metallic film includes a titanium-tellurium alloy.

12. The apparatus of claim 11, wherein the first metal nitride and the second metal nitride are the same material.

13. The apparatus of claim 11, wherein the phase change material includes at least one of indium-antimony-tellurium or germanium-antimony-tellurium.

14. The apparatus of claim 11, wherein the phase change material includes selenium.

15. The apparatus of claim 11, wherein a thickness of the metallic film is less than a thickness of the phase change material.

* * * * *